(12) United States Patent
Sayago et al.

(10) Patent No.: US 10,700,668 B2
(45) Date of Patent: Jun. 30, 2020

(54) METHOD AND APPARATUS FOR PULSE GENERATION

(71) Applicant: Analog Devices Global Unlimited Company, Hamilton (BM)

(72) Inventors: David Sayago, Valencia (ES); Thomas F. Roche, Ballycotton (IE); John A. Cleary, Kilmallock (IE)

(73) Assignee: Analog Devices Global Unlimited Company, Hamilton (BM)

( * ) Notice: Subject to any disclaimer, the term of this patent is extended or adjusted under 35 U.S.C. 154(b) by 78 days.

(21) Appl. No.: 16/010,219

(22) Filed: Jun. 15, 2018

(65) Prior Publication Data

US 2019/0386643 A1 Dec. 19, 2019

(51) Int. Cl.
| | | |
|---|---|---|
| H03K 3/017 | (2006.01) | |
| H03K 3/037 | (2006.01) | |
| H03K 21/10 | (2006.01) | |
| H02M 3/07 | (2006.01) | |

(52) U.S. Cl.
CPC .............. *H03K 3/017* (2013.01); *H02M 3/07* (2013.01); *H03K 3/037* (2013.01); *H03K 21/10* (2013.01)

(58) Field of Classification Search
CPC ........ H03K 3/017; H03K 3/037; H03K 21/10; H02M 3/07; H02M 3/073
See application file for complete search history.

(56) References Cited

U.S. PATENT DOCUMENTS

| | | | |
|---|---|---|---|
| 4,935,944 A | 6/1990 | Everett | |
| 5,142,247 A * | 8/1992 | Lada, Jr. ................. | H03L 7/18 331/14 |
| 5,684,434 A | 11/1997 | Mann et al. | |
| 5,714,896 A | 2/1998 | Nakagawa et al. | |
| 5,748,949 A | 5/1998 | Johnston | |

(Continued)

FOREIGN PATENT DOCUMENTS

| | | |
|---|---|---|
| JP | 2005045507 A | 2/2005 |
| TW | 425766 B | 3/2001 |

OTHER PUBLICATIONS

Kumari, et al., "Programmable Frequency Divider Design for Multi-Ghz Phase Locked Loop (PLL) System," International Journal of Electronic and Electrical Engineering, vol. 7, No. 9, 2014, pp. 1001-1006.

(Continued)

*Primary Examiner* — Patrick C Chen
(74) *Attorney, Agent, or Firm* — Knobbe, Martens, Olson & Bear LLP

(57) ABSTRACT

The present disclosure provides a pulse generator which generates a pulse train by mixing pulses of a first clock having a first frequency, with pulses of a second clock having a second frequency. Over a predefined time period, the combination of pulses results in a pulse train having an effective frequency which is between the first and second frequencies. A multiplexer is used to select which of the first and second clocks should be provided to the output. Depending on the desired target frequency, the multiplexer is controlled to mix differing amounts of pulses from the first and second clocks. A multiplexer is controlled by a control signal, which is generated using combinatorial logic using the first clock as an input. The pulse generator may be used, for example, as a clock for a charge pump.

20 Claims, 9 Drawing Sheets

(56) References Cited

U.S. PATENT DOCUMENTS

| | | | |
|---|---|---|---|
| 5,777,521 A | 7/1998 | Gillig et al. | |
| 5,914,996 A | 6/1999 | Huang | |
| 6,356,123 B1 | 3/2002 | Lee et al. | |
| 6,404,291 B1 | 6/2002 | Riley | |
| 6,707,327 B2 | 3/2004 | Choi et al. | |
| 6,807,552 B2 | 10/2004 | Bredin et al. | |
| 6,861,881 B1 | 3/2005 | Neravetla et al. | |
| 6,956,793 B2 | 10/2005 | Ngo | |
| 7,046,048 B2* | 5/2006 | Starr | G06F 1/08 327/298 |
| 7,492,852 B1 | 2/2009 | Liu | |
| 7,812,648 B2 | 10/2010 | Wood | |
| 8,633,739 B2 | 1/2014 | Badillo | |
| 8,704,557 B2 | 4/2014 | Malmcrona et al. | |
| 8,891,725 B2 | 11/2014 | Terrovitis | |
| 9,048,843 B1 | 6/2015 | Nordyke | |
| 9,088,287 B2 | 7/2015 | Choi et al. | |
| 2002/0113660 A1* | 8/2002 | Dally | H03K 3/0315 331/135 |
| 2003/0020522 A1 | 1/2003 | Dellow | |
| 2003/0034810 A1 | 2/2003 | Trivedi et al. | |
| 2003/0092419 A1 | 5/2003 | Nobbe et al. | |
| 2004/0213369 A1 | 10/2004 | Austin | |
| 2006/0132200 A1 | 6/2006 | Dietl | |
| 2007/0147571 A1 | 6/2007 | Yu et al. | |
| 2014/0253188 A1* | 9/2014 | Choi | H03K 23/42 327/115 |
| 2015/0171849 A1 | 6/2015 | Vo et al. | |
| 2016/0013784 A1 | 1/2016 | Jiang | |
| 2017/0134030 A1 | 5/2017 | Mofidi et al. | |
| 2018/0139404 A1* | 5/2018 | Murakami | H04N 5/05 |

OTHER PUBLICATIONS

Chapter 4: Design of Fractional-N Clock Divider, pp. 57-68, available at: shodhganga.inflibnet.ac.in/jspui/bitstream/10603/117846/12/12_chapter%204.pdf (accessed: Aug. 9, 2018).

Analog Devices, Data Sheet: ADF4152HV, Fractional-N/Integer N PLL Synthesizer, Rev. 0, Jul. 2016, 27 pages.

* cited by examiner

METHOD AND APPARATUS FOR PULSE GENERATION

FIELD OF DISCLOSURE

The present disclosure relates to a method and apparatus for pulse generation. In particular, the disclosure relates to generation of a pulse train by mixing first and second clocks of different frequencies.

BACKGROUND

In electronics and communications devices, it is often important for certain actions to be timed or synchronised. System clocks may be used by electronic components for this purpose. For example, a system clock may be used to control a charge pump. In a charge pump, charge is passed from a voltage supply, via a sequence of capacitors, towards an output. The charge is moved towards the output on each transition of the clock. For a variety of reasons, it may be desirable to reduce the amount of charge being delivered by the charge pump. An integer frequency divider, such as a divide-by-two counter, may be used to reduce the frequency of the system clock by a factor of two. While such components are straightforward to implement, dividing the frequency of the main clock by two may result in a reduction in the transfer of charge in the charge pump to a greater extent than desired.

As an alternative, a non-integer frequency divider may be provided using a phase-locked loops (PLLs). Such an arrangement may allow for a clock to be generated having a frequency that is particular fraction of the system clock frequency. This allows for small reductions in the amount of charge being transferred by the charge pump. However, PLLs can include a relatively large number of components, which take up a large surface area of the device. For a variety of reasons, PLLs may not be available or desired.

SUMMARY OF THE DISCLOSURE

The present disclosure provides a pulse generator which generates a pulse train by mixing pulses of a first clock having a first frequency, with pulses of a second clock having a second frequency. Over a predefined time period, the combination of pulses results in a pulse train having an effective frequency which is between the first and second frequencies. In one example, the second frequency may be half the first frequency, and the effective frequency is a non-integer division of the first frequency. The first clock may be the system clock, and the second clock may be generated from the first clock using a divide-by-two counter. A multiplexer is used to select which of the first and second clocks should be provided to the output. Depending on the desired target frequency, the multiplexer is controlled to mix differing amounts of pulses from the first and second clocks. A multiplexer is controlled by a control signal, which is generated using combinatorial logic using the first clock as an input. The pulse generator may be used, for example, as a clock for a charge pump. A charge pump does not require a clock having a constant frequency. Instead, the number of rising and falling edges is an important factor in determining how much charge is delivered by the charge pump. This arrangement enables fine tuning of the effective frequency of the pulse train, and hence the amount of charge delivered by the charge pump.

In a first aspect, the present disclosure provides a pulse generator, comprising: a clock selector configured to receive at least a first clock signal having a first frequency and a second clock signal having a second frequency, lower than the first frequency, and configured to select the first clock signal or the second clock signal to generate, at an output of the clock selector, a pulse train having a combination of pulses from the first and second clocks; and a control circuit configured to generate a control signal to control the clock selector to select the first clock signal or the second clock signal, such that the pulse train has effective frequency, during a predefined period, that is equal to a target frequency.

In a second aspect, the present disclosure provides a charge pump comprising the pulse generator of the first aspect.

In a third aspect, the present disclosure provides a method of performing non-integer frequency division, comprising: receiving at least a first clock signal having a first frequency and a second clock signal having a second frequency, lower than the first frequency; selecting the first clock signal or the second clock signal to generate a pulse train, having a combination of pulses from the first and second clocks, and having an effective frequency, over a predefined period, that is equal to a target frequency.

In a fourth aspect, the present disclosure provides an apparatus configured to generate a pulse train by mixing pulses from at least a first clock having a first frequency and a second clock having a second frequency, lower than the first frequency, such that the pulse train has an effective frequency, over a predefined period, which is equal to a target frequency, and between the first and second frequencies.

Further features and embodiments of the present disclosure are detailed in the appended claims.

BRIEF DESCRIPTION OF THE DRAWINGS

The present disclosure will now be described, by way of example only, and with reference to the accompanying drawings, in which.

DETAILED DESCRIPTION

Figure 1:
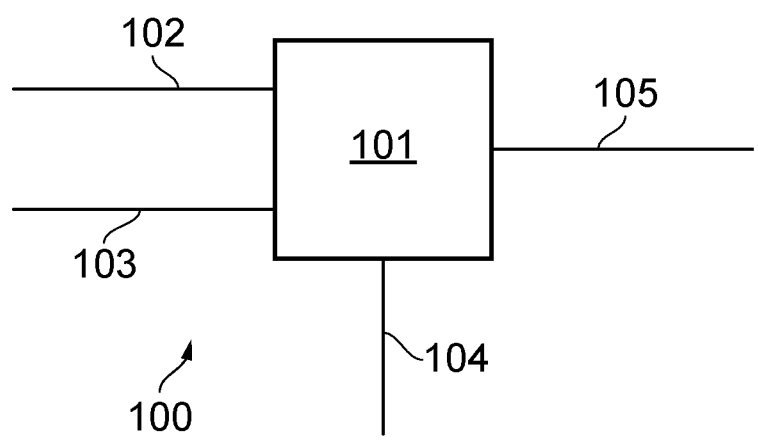
FIG. 1 is a pulse generator in accordance with an embodiment of the disclosure.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The present disclosure relates to a pulse generator. It is known to provide clocks having a duty cycle of 50% for a number of different applications. For example, a charge pump may be controlled by such a clock. Charge is delivered to a charge pump output based on the rising and falling edges of the clock. In this disclosure, the term "clock" refers to a clock signal. The present disclosure provides a pulse generator which mixes two clocks together, in a predefined period, in order to generate a pulse train which is a mix of pulses from a first clock having a first frequency and a second clock having a second frequency. Within the predefined period, the pulse train has an effective frequency which is equal to the average frequency of the two sets of pulses. By controlling the number of pulses from the first clock and the number of pulses from the second clock in a given period, the effective frequency of the pulse train delivered to the output may be fine-tuned. The effective frequency may be a non-integer division of the first clock, and also a frequency between the frequencies of the first and second clocks. Such an arrangement is particularly useful with charge pumps, where the amount of charge passed towards the output of a charge pump is typically dictated by the rate of pulses over time. The charge pump does not require a clock having a constant frequency over a given time period, although this is how charge pumps are typically controlled.

The present disclosure utilises a single source clock, which may be the system clock. A second clock can be provided by dividing the frequency of the first clock in two, for example by using a divide-by-two counter. The two clocks are then provided to a multiplexer which can be controlled by a control signal to determine how many of the pulses of the first clock and how pulses of the second clock are used in a given period. Combinatorial logic may then be used to determine the control signal, for example, based on a counter and a state machine. Such an arrangement is simpler than using a phase-locked loop (PLL), but provides fine-tuning that may not be available from clocks which have been integer divided.

FIG. 1 shows a pulse generator 100 in accordance with an embodiment of the disclosure. The pulse generator 100 includes a clock selector 101. The clock selector 101 is connected to two clock inputs. A first clock input 102 is configured to provide a first clock clk1 at a first frequency f1. A second clock input 103 is configured to provide a second clock clk2 at a second frequency f2. In one embodiment, the frequency of f2 is half the frequency of f1. However, f2 may have a frequency which has a different relationship to the frequency f1. For example, f2 could be one third or one quarter of f1. f2 may have a frequency which is an integer division of f1. f2 is generally less than f1. To ensure that the pulse train is glitch-free, f2 should be a rational divider of f1. In alternative embodiments, the clock selector 101 may receive three or more clocks, each having a different frequency.

The clock selector 101 is also connected to a control line 104. Control line 104 provides the clock selector 101 with a control signal. The clock selector 101 selects clock f1 or clock f2 for output based on the control signal. The clock selector 101 is also connected to an output line 105. Depending on the control signal, the clock selector 101 outputs the first clock clk1 or the second clock clk2 via output line 105. For example, when the control signal is a '1' then the clock selector 101 may output the first clock clk1. When the control signal is a '0' then the clock selector 101 may output the second clock clk2. As such, the output signal may be, in a given period, the first clock clk1, the second clock clk2, or a combination of clocks clk1 and clk2. When the output is a combination of the clocks clk1 and clk2, the output signal, over a given period, has an effective frequency, fD.

Figure 2:
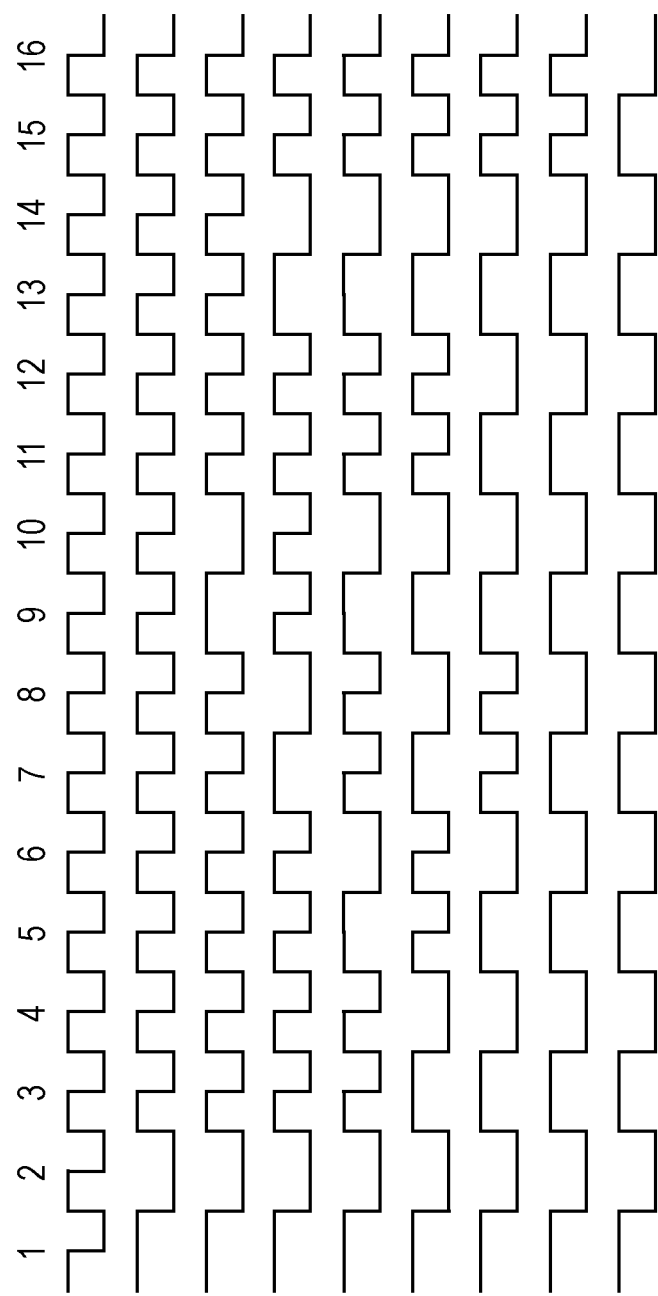
FIG. 2 is a timing chart showing the operation of the pulse generator of FIG. 1.

FIG. 2 is a timing chart showing various outputs of the clock selector 101 based on a number of different control signals. Each line in the figure shows a pulse train over a period equivalent to sixteen times f1. Each line shows the number of short pulses (i.e., the first clock clk1) and the number of long pulses (i.e., the second clock clk2) together with the effective frequency fD of the pulse train during this period. Assuming a constant fD is desired, the same pattern is repeated for each consecutive period. The pulse generator 100 may be factory set so that it should produce the same pattern of pulses in each consecutive period. Alternatively, it may be controllable by an input signal to vary the output depending on the desired effective frequency fD. In this example, because fD may be between f1 and f2, fD is a non-integer division of f1. The pulse generator may be regarded as a non-integer effective frequency divider.

As can be seen from the first line of FIG. 2, if the clock selector 101 selects only the first clock clk1, a series of sixteen short pulses having frequency f1 are output on the output line 105. In the last line, a series of eight long pulses equivalent to the second clock clk2 are selected by the clock selector 101, such that the output fD is equivalent to 0.5×f1. For each of the lines in between, a combination of pulses from the first clock clk1 and the second clock clk2 are output on the output line 105. The effective frequency fD is calculated by the following equation:

$$fD = f1 * \frac{(n+m)}{(n+2*m)}$$

where n is the number of pulses of the first clock clk1 and m is the number of pulses of the second clock clk2.

Figure 3:
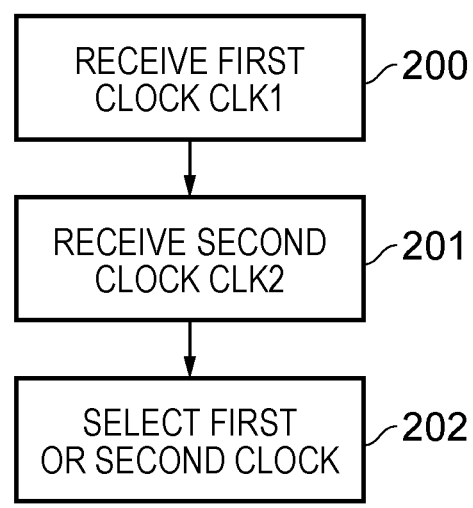
FIG. 3 is a flow-chart showing a method of operation of the pulse generator of FIG. 1.

A method of operation of the pulse generator 100 will now be described with reference to FIG. 3. In a first step, the clock selector 101 receives the first clock clk1 (step 200). Clock selector 101 also receives the second clock clk2 (step 201). The clock selector 101 then selects either the first clock signal clk1 or the second clock signal clk2 to generate a pulse train (step 202). The pulse train has an effective frequency, over a predefined period, such that the effective frequency is equal to a target frequency. The target frequency is greater than or equal to the second frequency and less than or equal to the first frequency.

Figure 4:
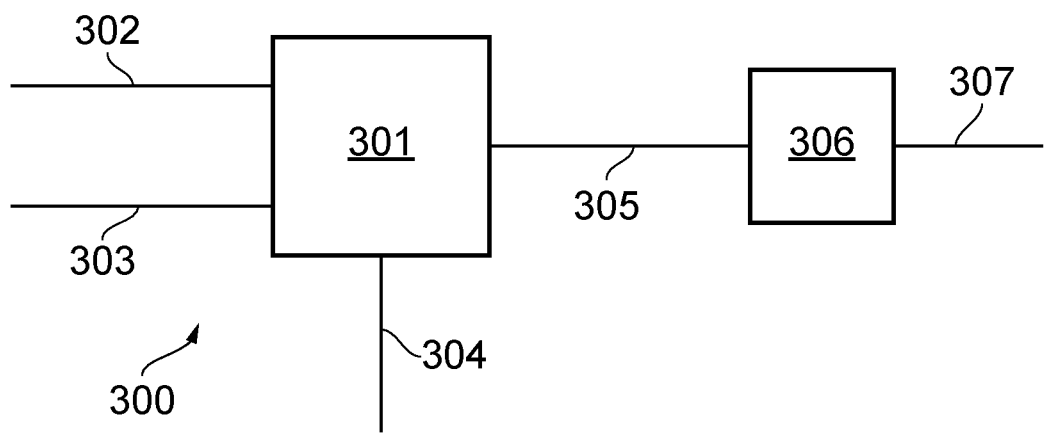
FIG. 4 is a pulse generator in accordance with a further embodiment.

One use for the above-described pulse generator is for supplying a clock to a charge pump. FIG. 4 shows a pulse generator 300 in accordance with a further embodiment. The pulse generator 300 is the same as the pulse generator 100. As such, the pulse generator 300 includes a clock selector 301, a first clock input 302, a second clock input 303, a control line 304, and an output line 305. In addition, the output line 305 is connected to a charge pump 306. The charge pump 306 is connected to a charge pump output 307. An advantage of the above-described pulse generator is that it enables the charge pump to be fine-tuned. If the charge pump were only able to receive the first clock clk1 or the second clock clk2, then the charge pump would only be able to deliver charge based on those discrete clocks. However, a charge pump does not need to receive a clock with a specific and constant frequency. A charge pump may accept a pulse train having different pulses at different frequencies. It is the effective frequency that is typically important in terms of the charge delivered by the charge pump. Because each transition of the clock supplied to the charge pump causes charge to be transferred towards the output, a slight reduction in the effective frequency, by mixing the second clock with the first clock, results in a reduction in the amount of charge delivered to the output, by a similar order of magnitude. While phased-locked loops (PLLs) enable non-integer clocks to be generated, a PLL is not always available or desirable. The pulse generator of the present disclosure enables a pulse train having an effective frequency which is a non-integer division of a main clock, having a 50% duty cycle, to be supplied to a charge pump.

The pulse generator of the present disclosure may be utilised with any circuit that desires a pulse train having an effective frequency that is lower than a system clock. In particular, the pulse generator is suitable for circuits in which synchronisation is not required, and where the important factor is the rate of pulses over time.

Figure 5:
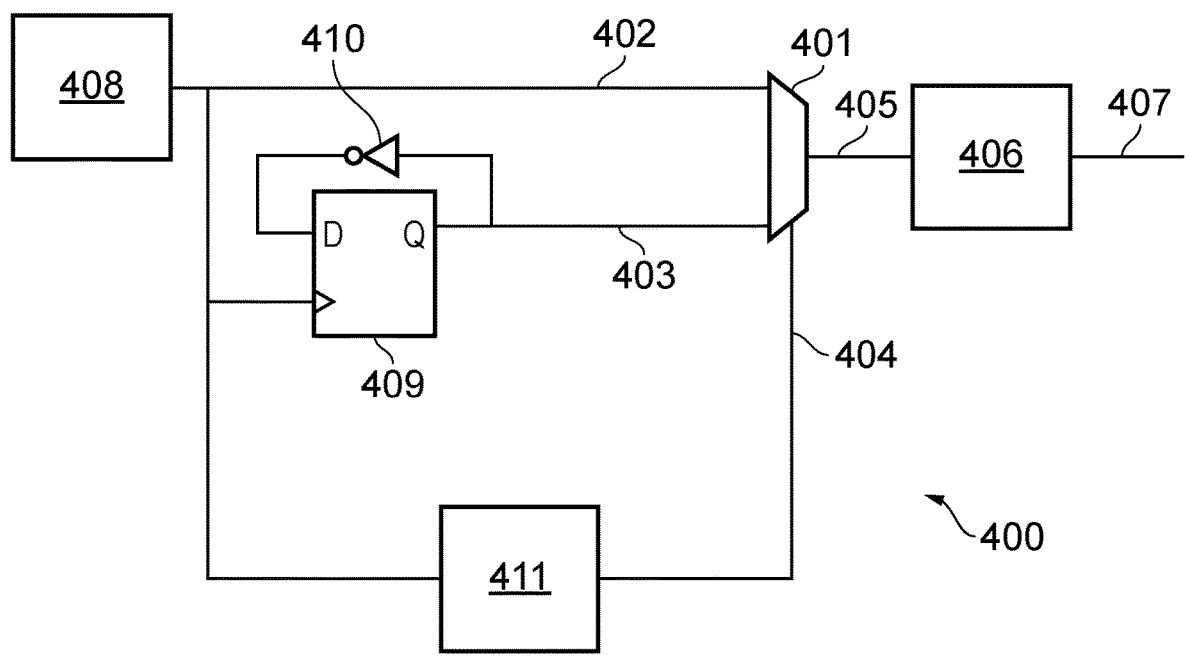
FIG. 5 is a pulse generator in accordance with a further embodiment.

FIG. 5 shows a pulse generator 400 in accordance with a further embodiment. In this embodiment, the clock selector is a multiplexer 401. The multiplexer 401 is connected to a first clock input 402. The first clock input 402 supplies a first clock clk1 having a frequency f1. The multiplexer 401 is also connected to a second clock input 403. The second clock input 403 supplies a second clock clk2 having a frequency f2. In this example, f2 is half of f1. The multiplexer 401 is connected to a control line 404 which supplies a control signal. An output of the multiplexer is connected to an output line 405, which is connected to a charge pump 406. The charge pump 406 includes a charge pump output 407. The charge pump 406 does not form part of the pulse generator 400. In this example, the pulse generator 400 is connected to the charge pump 406. However, the pulse generator may be used in other applications, as will be discussed in more detail below.

The first clock clk1 is generated by clock source 408. The clock source 408 may be any suitable system clock that has a duty cycle of 50%. The first clock clk1 is also supplied to a clock input of first flip-flop 409. First flip-flop 409 is configured as a divide-by-2 counter. The Q output of the first flip-flop 409 is fed back through a NOT gate 410 to the D input of the first flip-flop 409. As such, the Q output generates the second clock clk2 with frequency f2. This is connected to the second clock input 403. As such, the multiplexer 401 is supplied with clocks clk1 and clk2. A divide-by-2 counter is described here as one example of an integer divider. Other circuits and arrangements may be used as an alternative to the flip-flop 409.

The first clock clk1 is also supplied to control logic 411. Based on the first clock clk1, the control logic 411 is configured to generate a control signal for controlling multiplexer 401. The control logic 411 may be factory set to control the multiplexer 401 to generate any of the pulse trains shown in FIG. 2. Alternatively, the control logic 411 may be controllable to produce a control signal to produce different pulse trains depending on a particular input.

Figure 6:
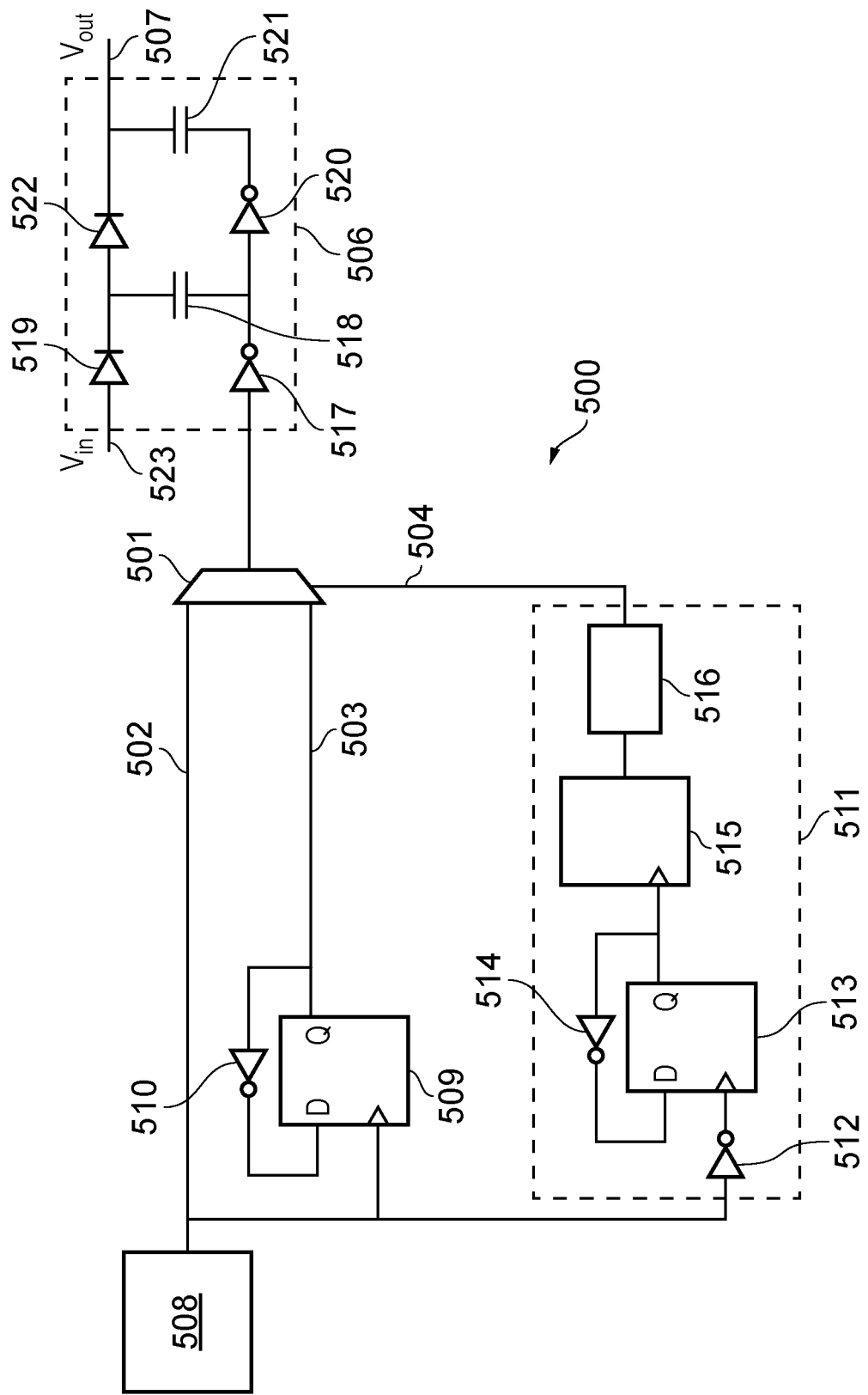
FIG. 6 is a pulse generator in accordance with a further embodiment.

FIG. 6 shows a pulse generator 500 in accordance with a further embodiment. Pulse generator 500 is the same as pulse generator 400, except that it includes an example implementation of the control logic 411 and an example implementation of the charge pump 406. The pulse generator includes, a multiplexer 501. The multiplexer 501 is connected to a first clock input 502. The first clock input 502 supplies a first clock clk1 having a frequency f1. The multiplexer 501 is also connected to a second clock input 503. The second clock input 503 supplies a second clock clk2 having a frequency f2. In this example, f2 is half of f1. The multiplexer 501 is connected to a control line 504 which supplies a control signal. An output of the multiplexer is connected to an output line 505, which is connected to a charge pump 506. The charge pump 506 includes a charge pump output 507. The charge pump 506 does not form part of the pulse generator 500.

The first clock clk1 is generated by clock source 508. The clock source 508 may be any suitable system clock that has a duty cycle of 50%. The first clock clk1 is also supplied to a clock input of first flip-flop 509. First flip-flop 509 is configured as a divide-by-2 counter. The Q output of the first flip-flop 509 is fed back through a NOT gate 510 to the D input of the first flip-flop 509. As such, the Q output generates the second clock clk2 with frequency f2. The rising edges of clk1 and clk2 are synchronous. The Q output is connected to the second clock input 503. As such, the multiplexer 501 is supplied with clocks clk1 and clk2.

The control logic 511 includes NOT gate 512, which is connected to a clock input of a second flip-flop 513. The second flip-flop is also configured as a divide-by-2 counter. The Q output of flip flop 513 is connected to a NOT gate 514, which is fed back to the D input of flip flop 513. The Q output of flip flop 513 is connected to the clock input 515 of a counter 515. The output of counter 515 is connected to control signal generator 516. An output of control signal generator 516 is connected to control line 504.

Figure 7:
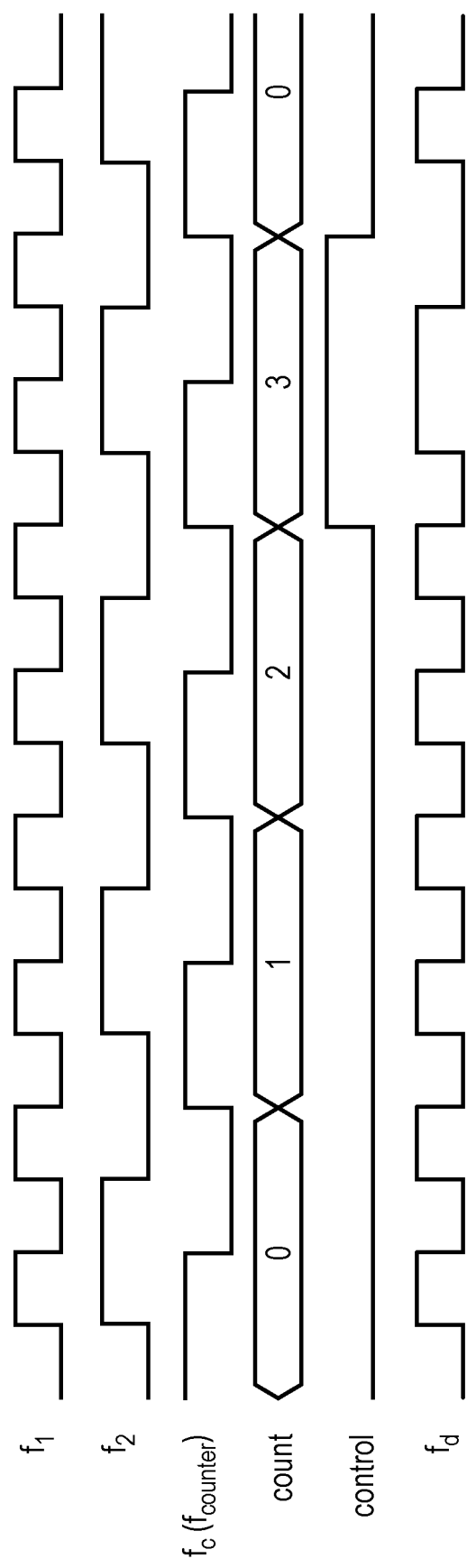
FIG. 7 is a timing diagram showing the operation of the pulse generator of FIG. 6.

The timing chart for pulse generator 500 is shown in FIG. 7. As can be seen, f1 and f2 are shown in lines 1 and 2 of the timing chart. The output of the second flip-flop 513 is shown in line 3. This is a clock having the same frequency as f2 but delayed by ¾ of a cycle. As such, the rising edge of the output of flip-flop 513 corresponds to a falling edge of clock f1. In this case, the counter 515 is a two-bit counter which counts up from 0 to 3 on the rising edge of the output clock of flip-flop 513. The counter is synchronous with the failing edge of clk1, which is when clk2 does not change. As such it is possible to switch between clk1 and clk2 without any glitches. This is a straight-forward way of avoiding glitches. To obtain a 50% duty cycle, only entire pulses from clk2 can be used. The maximum frequency of the counter is f2, which means clk1 pulses should come in pairs.

In an alternative embodiment, the counter may be synchronous with the rising edge of clk1. However, because clk2 also changes at this point, glitches may result. For certain applications, this may not be an issue. Alternatively, additional circuitry may be used to eliminate glitches (such as a delay). As a further alternative, the counter could be synchronous with a rising edge with a version of clk1 delayed by half a cycle. This would also prevent glitches.

In the above-noted examples, clk2 is generated with a frequency divider which is synchronous with the rising edge of clk1. In a further alternative, the frequency divider may be synchronous with the falling edge of clk1, and the counter may be synchronised with the rising edge of clk1 to ensure there are no glitches.

In summary, in order to prevent glitches in the pulse train, the counter can be synchronous with an edge of clk1 that occurs when clk2 is not transitioning between states.

As can be seen in FIG. 2 or 7, for a particular counter, there is a limit to the number of combinations of clk1 and clk2 that can be produced in a given period. As such, the available effective frequencies are limited by the size of the counter. Increasing the size of the counter enables a greater number of effective frequencies to be achieved, and as such, a reduction in the step between consecutive effective frequencies.

The control signal generator 516 is another set of control logic that determines whether to output a '0' or a '1' on the control line 504, in order to generate a pulse train having an effective frequency fD. In this example, the control logic is pre-set to output a '1' when the counter counts to 3. During this phase, the multiplexer outputs to the second clock clk2 rather than the first clock clk1. In this case, fD is determined as follows:

$$fD = f1 * \frac{(6+1)}{(6+2*1)}$$

So, fD equals ⅞×f1.

The charge pump 506 includes a first NOT gate 517, which is connected to capacitor 518. Capacitor 518 is connected to the output of a diode 519, which is in turn connected to a supply voltage yin 523. A further NOT gate 520 is connected in series with the output of NOT gate 517. The output of NOT gate 520 is connected to a capacitor 521. A further diode 522 is connected in series with the output of the diode 519. The output of diode 522 is connected to the capacitor 521 and the output $V_{out}$ of the charge pump 507.

For charge pump 506, configured to operate at frequency f1, when the pulses are at f2, charge is moved more slowly towards the output of the charge pump. As such, the present disclosure enables fine-tuning of the charge pump 506 such that less charge is delivered than would be the case with clk1, but more charge is delivered than would be the case with clk2. This is achieved without a PPL providing a non-integer division of clk1. This enables the efficiency of the charge pump to be improved, by selecting a frequency that provides a desired efficiency for a particular load. This is because efficiency typically depends on load and frequency. Increasing the frequency increases the maximum achievable load, but generally at the expense of lower efficiency for smaller loads. As such, choosing the maximum frequency is not always the best option. If the maximum load can be reduced, then so can the frequency and the efficiency of the charge pump. The present disclosure provides a mechanism for achieving incremental reductions in frequency, using only a single clock.

Figure 8:
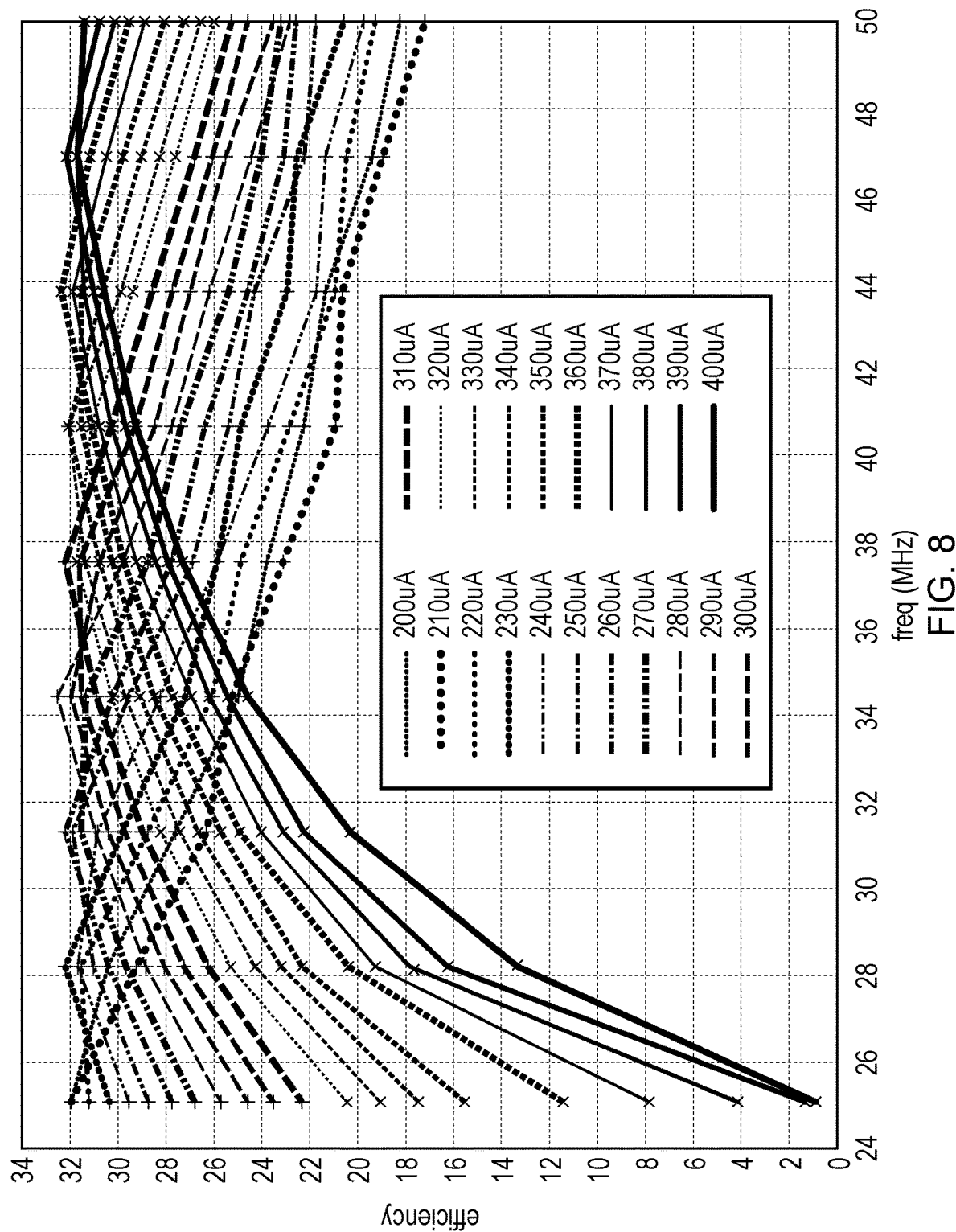
FIG. 8 is a chart showing frequency versus efficiency for a charge pump under different loads.

FIG. 8 is a chart showing frequency versus efficiency for a charge pump for different loads. As can be seen, as the load decreases, the frequency at which the highest efficiency is achieved also decreases.

This arrangement does result in a low frequency ripple. However, as the clock frequency is much higher than the control loop frequency, the low frequency ripple is insignificant in the regulated output. As such, modulating the frequency of the clock in this way does not affect the regulation of the output.

The control signal generator 516 may include further combinatorial logic to generate a control signal for controlling the multiplexer. For example, the control signal generator may be a state machine that generates a '1' when the output of the counter 515 equals a particular number. In the example given above, the state machine would generate a '1' when the counter reaches '3', else it would generate a '0'. A state machine may be appropriate when the pulse generator 500 is factory set to generate a pulse train having a constant profile and effective frequency.

As an alternative, the control signal generator may include a digital comparator and a look up table (LUT). The LUT may store one or more digital values, one or which is compared with the output of the counter 515. The comparator will generate a '1' if there is a match, else it will generate a '0'. By using a LUT, different values may be stored, which enable the pulse generator 500 to generate different pulse trains depending on the value selected in the LUT. This enables the pulse generator to be controllable by a user.

Figure 9:
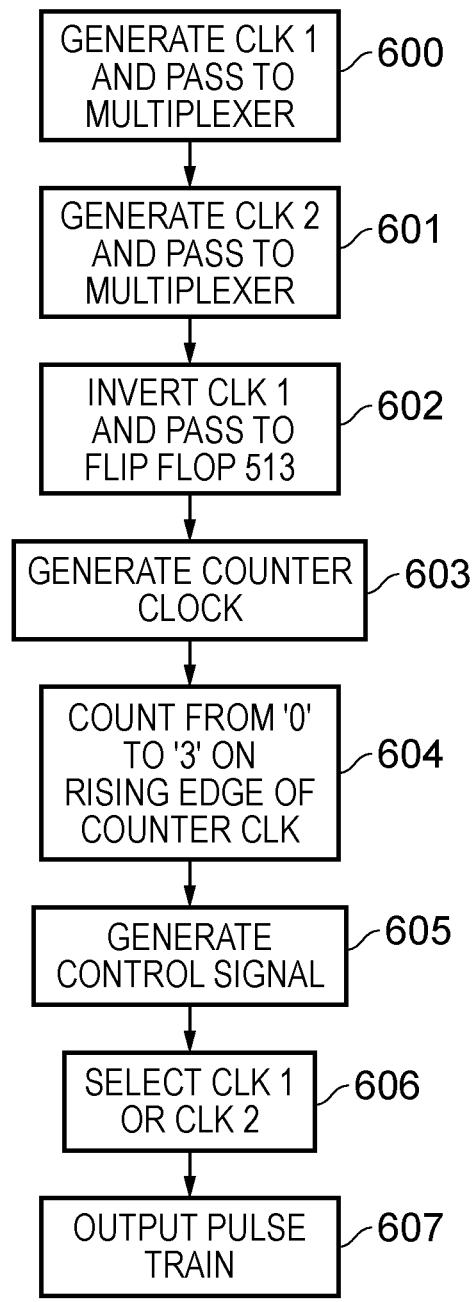
FIG. 9 is a flow-chart showing a method of operation of the pulse generator of FIG. 6.

A method of operation of the pulse generator 500 will now described with reference to FIG. 9. In a first step, clock source 508 generates clk1 at frequency f1 which is passed directly to the multiplexer 501 (step 600). The flip-flop 509 generates clk2 at frequency f2 which is also passed to the multiplexer 501 (step 601). Clk1 is inverted by NOT gate 512, and passed to flip-flop 513 (step 602). Flip-flop 513 generates a counter clock at frequency fc, which is a delayed version of clk 2 (step 603). The 2-bit counter 515 counts from 0 to 3 on the rising edge of the counter clock (step 604). The control signal generator 516 generates a '1' when the counter output is '3', and a '0' the rest of the time (step 605). The multiplexer 501 outputs clk1 when the control signal is '0' and clk2 when the control signal is '1' (step 606). As such, the output of the multiplexer 501 is a pulse train, which in a given cycle includes 6 pules of clk1, and 1 pulse of clk2 (step 607). In this example, the effective frequency fD is ⅞*f1. As will be appreciated, the control signal generator 516 may generate different outputs, based on the counter, and depending on the desired frequency.

In the above-described disclosure, the pulse train generated by the pulse generator has been described as having an effective frequency. The effective frequency is the average frequency over a particular repeating period.

Unless the context indicates otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, systems, devices, and integrate circuits described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

The claims presented herein are in single dependency format suitable for filing at the United States Patent & Trademark Office. However, it is to be assumed that each one of the claims can be multiply dependent on any preceding claim except where that is technically unfeasible.

What is claimed is:

1. A pulse generator, comprising:
   a clock selector configured to receive at least a first clock signal having a first frequency and a second clock signal having a second frequency, lower than the first frequency, and configured to select the first clock signal or the second clock signal to generate, at an output of the clock selector, a pulse train having a combination of pulses from the first and second clock signals; and
   a control circuit configured to, during a predefined period, generate a control signal to control the clock selector to select a first predetermined number of pulses from the first clock signal and a second predetermined number of pulses from the second clock signal, such that the pulse train has an effective frequency, during the predefined period, that is equal to a target frequency.

2. A pulse generator according to claim 1, wherein the control circuit is further configured to control the clock selector such that the effective frequency is the target frequency over a plurality of successive periods.

3. A pulse generator according to claim 2, wherein the target frequency remains the same over the plurality of successive periods.

4. A pulse generator according to claim 1, wherein the clock selector is a multiplexer.

5. A pulse generator according to claim 1, further comprising a frequency divider, configured to receive the first clock signal, and to generate the second clock signal.

6. A pulse generator according to claim 1, wherein the control circuit includes a counter configured to define the predefined period.

7. A pulse generator according to claim 6, wherein the counter is configured to count during the predefined period, and to reset at an end of the predefined period.

8. A pulse generator according to claim 6, wherein the control signal depends on an output of the counter.

9. A pulse generator according to claim 8, wherein, when the output of the counter takes at least a first value, the control signal selects the first clock signal, and when the output of the counter takes at least a second value, the control signal selects the second clock signal.

10. A pulse generator according to claim 9, wherein the control circuit further comprises a state machine, connected to the output of the counter, wherein the state machine generates the control signal based on the output of the counter.

11. A pulse generator according to claim 9, wherein the control circuit further comprises a digital comparator and a lookup table (LUT), wherein when the output of the counter matches a value in the LUT, the control signal controls the multiplexer to select the second clock signal.

12. A pulse generator according to claim 11, wherein the LUT includes a plurality of values and the control circuit is configured such that the value that matches the output of the counter is controllable.

13. A pulse generator according to claim 6, wherein the counter is configured to change state on a falling edge of the first clock signal.

14. A pulse generator according to claim 6, wherein an input of the counter is configured to receive a counter clock signal, and the counter is configured to count on a rising edge of the counter clock signal, wherein the counter clock signal is a delayed version of the second clock signal.

15. A pulse generator according to claim 14, wherein the control circuit further comprises a divide-by-2 flip-flop, wherein the input is the inverse of the first clock signal, and the output of the counter is the counter clock signal.

16. A pulse generator according to claim 1, wherein the first clock has a duty cycle of substantially 50%.

17. A charge pump comprising the pulse generator of claim 1.

18. A charge pump according to claim 17, wherein the pulse generator is configured to provide a clock signal for the charge pump, and wherein an amount of charge delivered by the charge pump is based on the effective frequency of the pulse train over the predefined period.

19. A method of performing non-integer frequency division, comprising:
   receiving at least a first clock signal having a first frequency and a second clock signal having a second frequency, lower than the first frequency; and
   selecting, during a predefined period, a first predetermined number of pulses from the first clock signal and a second predetermined number of pulses from the second clock signal to generate a pulse train, having a combination of pulses from the first and second clocks, and having an effective frequency, over the predefined period, that is equal to a target frequency.

20. An apparatus comprising circuitry configured to generate a pulse train by mixing at least a first predetermined number of pulses from a first clock signal having a first frequency and a second predetermined number of pulses from a second clock signal having a second frequency during a predefined period, lower than the first frequency, such that the pulse train has an effective frequency, over the predefined period, which is equal to a target frequency, and between the first and second frequencies.

* * * * *